United States Patent [19]
Wakabayashi

[11] Patent Number: 5,566,131
[45] Date of Patent: Oct. 15, 1996

[54] MEMORY CIRCUIT FOR DISPLAY APPARATUS

[75] Inventor: Toshiro Wakabayashi, Kagoshima, Japan

[73] Assignee: NEC Corporation, Tokyo, Japan

[21] Appl. No.: 504,806

[22] Filed: Jul. 19, 1995

[30] Foreign Application Priority Data

Jul. 22, 1994 [JP] Japan ................................ 6-170618

[51] Int. Cl.$^6$ ........................................ G11C 8/00
[52] U.S. Cl. ................................ 365/236; 365/233
[58] Field of Search ................................ 365/233, 236

[56] References Cited

FOREIGN PATENT DOCUMENTS 4-259990  9/1992  Japan .

Primary Examiner—David C. Nelms
Assistant Examiner—F. Niranjan
Attorney, Agent, or Firm—Young & Thompson

[57] ABSTRACT

A memory circuit for a display apparatus is required to rewrite a display memory with a clear data as a clear data operation. During the clear data operation, an address counter produces address information for accessing the display memory in response to a clock signal that has a clock rate higher than that a clock signal which is used during a normal operation in which the display memory is rewritten with display data or subject to a data read operation.

4 Claims, 6 Drawing Sheets

MEMORY CIRCUIT FOR DISPLAY APPARATUS

BACKGROUND OF THE INVENTION

1. Field of the Invention

The present invention relates to a memory circuit and, more particularly, to a circuit for accessing a display memory employed in a display apparatus such as a CRT or an LED.

2. Description of the Related Art

A memory circuit for a display apparatus is provided with a RAM as a display memory which stores display data having a one-to-one correspondence with respect to each dot or pixel on a display screen. Display data are thus written into the RAM by a CPU.

Upon turning a power supply on or in order to clear the display screen, it is often required to write blank data into all the bits of the RAM as a clear operation. To this end, all the addresses of the RAM are required to be sequentially selected one by one for access.

Referring to FIG. 4, a memory circuit according to a prior art includes a four-bit counter 1 for generating a display clock CD and a set of select signals SS in response to a clock CK, an address counter 2 for generating a set of address signals A0 to An for accessing a RAM 3 storing display data, a parallel-to-serial converter 4 for converting data supplied thereto into serial data DS in response to the select signals SS; and a data switching circuit 5 selecting one of display data DD and blank data DB and supplying the selected data to the display RAM 3 in response to a clear signal SC.

In operation, the counter 1 frequency-divides the clock CK at a rate of 1/16 and generates a clock signal CA which is in turn supplied to the address counter 2. The address counter 2 thus generates address signals A0 to An in response to the clock CA and sequentially reads the data in the RAM 3 by using the address signals A in synchronism with the display scan period. The parallel-to-serial converter 4 converts the thus-read parallel data DR into the serial data DS in response to the select signal SS composed of most significant three bits of the frequency-divided output of the clock CK from the counter 1.

In the normal display mode, the data switching circuit 5 selects the display data DD as the write parallel data DW for the RAM 3. Upon being supplied the clear signal SC, the data switching circuit 5 switches to select the blank data DB as the write parallel data DW in response to the supply of the clear signal SC and clears the RAM 3 by following the address signal A and writing the blank data DB in the RAM 3 in synchronism with the display scan period. In order to rewrite all the data in the RAM 3 with the blank data DB, a time for one frame corresponding with the display time for one screen, i.e., approximately 10 mS is thus required.

In this manner, the time required for clear operation depends on the display time for the display screen in the first conventional memory apparatus.

On the other hand, in this type of information processing apparatus, the request for the high speed processing is enhanced, and the clear operation of the display RAM in this display apparatus is not an exception.

Referring to FIG. 5 which is the block diagram showing a second memory apparatus disclosed in Japanese Patent Laid-open Publication No. Hei 4-259990 intending to increase the speed of the clear operation, this second conventional memory apparatus is provided with: an address generating portion 102 for sequentially addressing all the memory cells in a RAM 101 for each external clock by clear signals; and a controlling portion 103 for controlling the input and output of the same value with respect to an assigned address, and automatically clears and checks the RAM 101 by only the input of clear signals CLR. As described above, the second memory apparatus additionally includes the address generating portion and the controlling portion exclusively for the clear operation as well as the regular elements.

Similarly, referring to FIG. 6 which is a block diagram showing a third conventional memory apparatus disclosed in Japanese Patent Laid-open Publication No. Hei 2-089291 intending to increase the speed of the clear operation, the third conventional memory apparatus is a SRAM having an address decoder for selecting an arbitrary memory cell from the memory cells and provided with a clear function circuit which suppresses the address decoder in response to the clear signal and activates all the memory cells to write the same data. The clear operation of the SRAM is not based on the external data setting but completely processed within the RAM so that the cell base of the direct memory is operated to clear the data. Accordingly, since it is necessary to add the clear function to the internal circuit of the RAM itself, this apparatus is not of the general type.

Since the above-describe first conventional memory apparatus writes the blank data by sequentially selecting all the addresses of the display RAM one by one in synchronism with the display scan period in order to perform the clear operation, the time required for the clear operation depends on the display time of the display screen, thus taking much time.

Further, in the second conventional memory apparatus intending to increase the speed of the clear operation, the need for the address generating portion and the controlling portion exclusively for the clear operation which are unnecessary at the time of regular data writing/reading operation leads to the large circuit dimension.

Furthermore, in the third conventional memory apparatus intending to increase the speed of the clear operation, since the clear function which clears the data by operating the cell base of the direct memory must be additionally provided within the internal circuit of the display RAM, this apparatus is not general.

SUMMARY OF THE INVENTION

It is therefore an object of the present invention to provide an improved memory circuit.

Another object of the present invention to provide a memory circuit in which a clear data operation is performed at a high speed with a simplified circuit construction.

A memory apparatus according to the present invention comprises a clock counter responding to a first clock signal and generating a second clock signal, for a display memory, an address counter generating address information in response to a clock signal supplied thereto and accessing the display memory by use of the address information, and a selector selecting and supplying the first clock signal to the display memory when a control signal takes a first state and selecting and supplying the second clock signal to the display memory when the control signal takes a second state.

BRIEF DESCRIPTION OF THE DRAWINGS

The above and other objects, features and advantages of the present invention will be best understood by reference to the following detailed description taken in conjunction with the accompanying drawings, wherein.

DETAILED DESCRIPTION OF THE PREFERRED EMBODIMENTS

Figure 1:
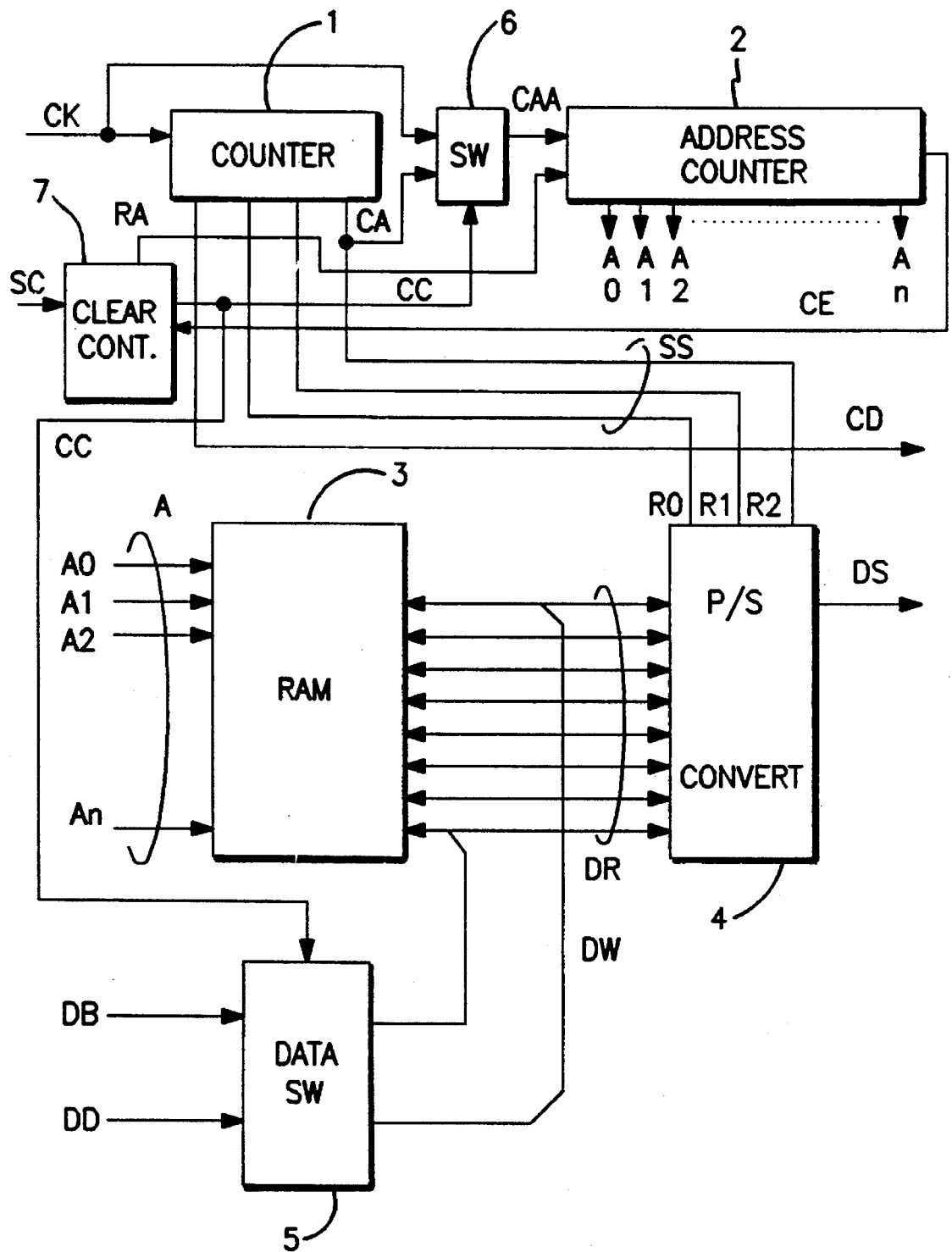
FIG. 1 is a block diagram showing a first embodiment of a memory circuit according to the present invention.
Figure 4:
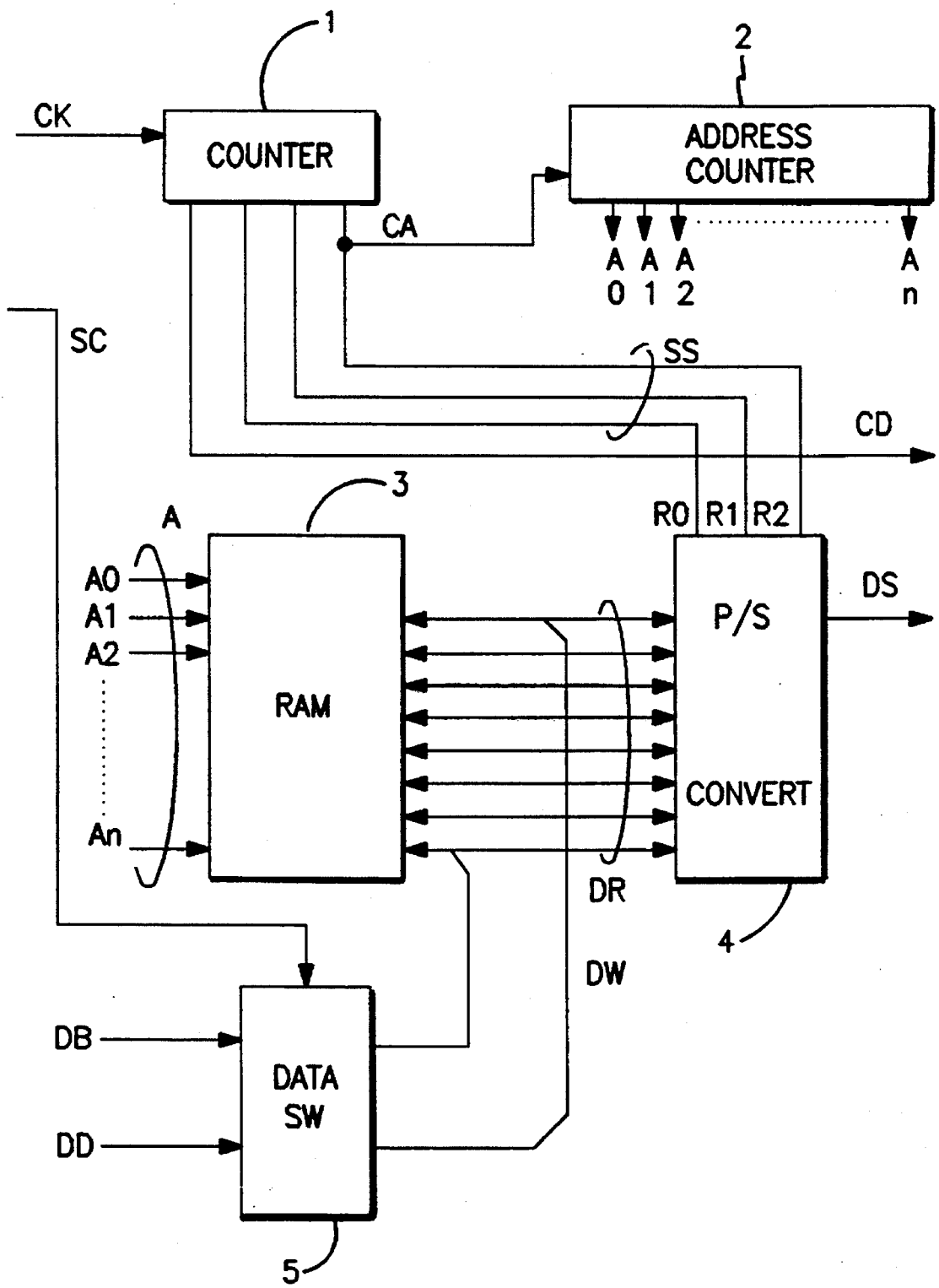
FIG. 4 is a block diagram showing a first conventional memory apparatus.
Figure 5:
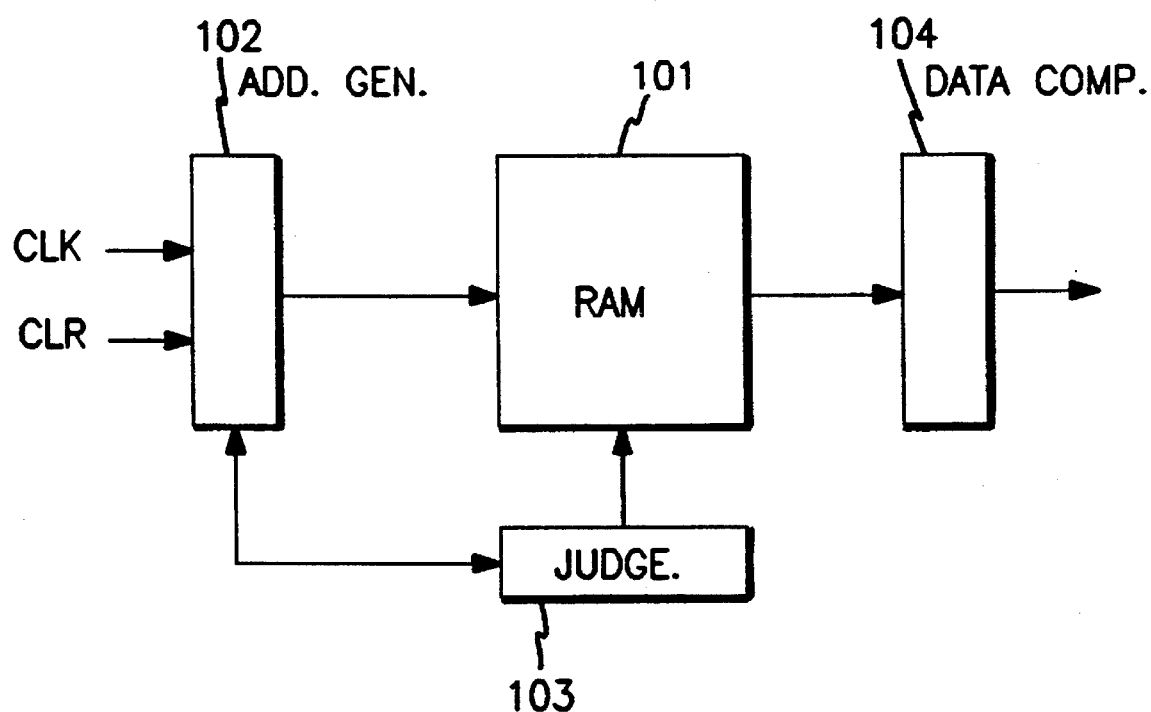
FIG. 5 is a block diagram showing a second conventional memory apparatus.
Figure 6:
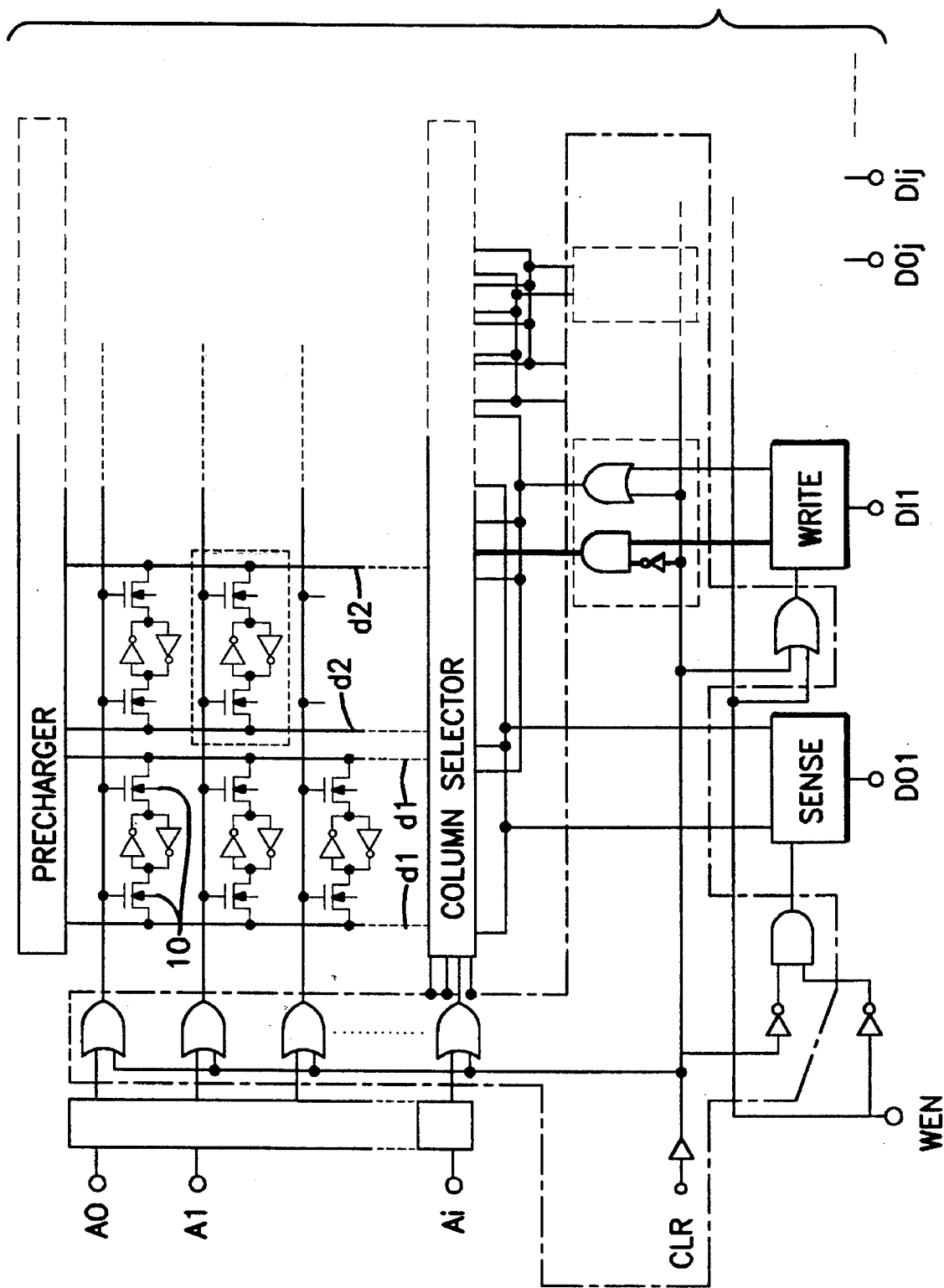
FIG. 6 is a block diagram showing a third conventional memory apparatus.

Referring to FIG. 1 which is a block diagram showing a first embodiment according to the present invention by similarly giving like reference characters/numerals to like or corresponding elements in FIG. 4, an illustrated memory circuit of this embodiment includes a counter 1, an address counter 2, a RAM 3, a parallel-to-serial converter 4, and a data switching circuit 5. This circuit further includes a clock switching circuit 6 for switching a clock CAA to be supplied to the address counter 2, and a clear signal controlling circuit 7 for generating a reset signal RA for the address counter 2 and a clear execution signal CC for controlling both the data switching circuit 5 and the clock switching circuit 6 in response to a clear control signal SC.

Figure 2:
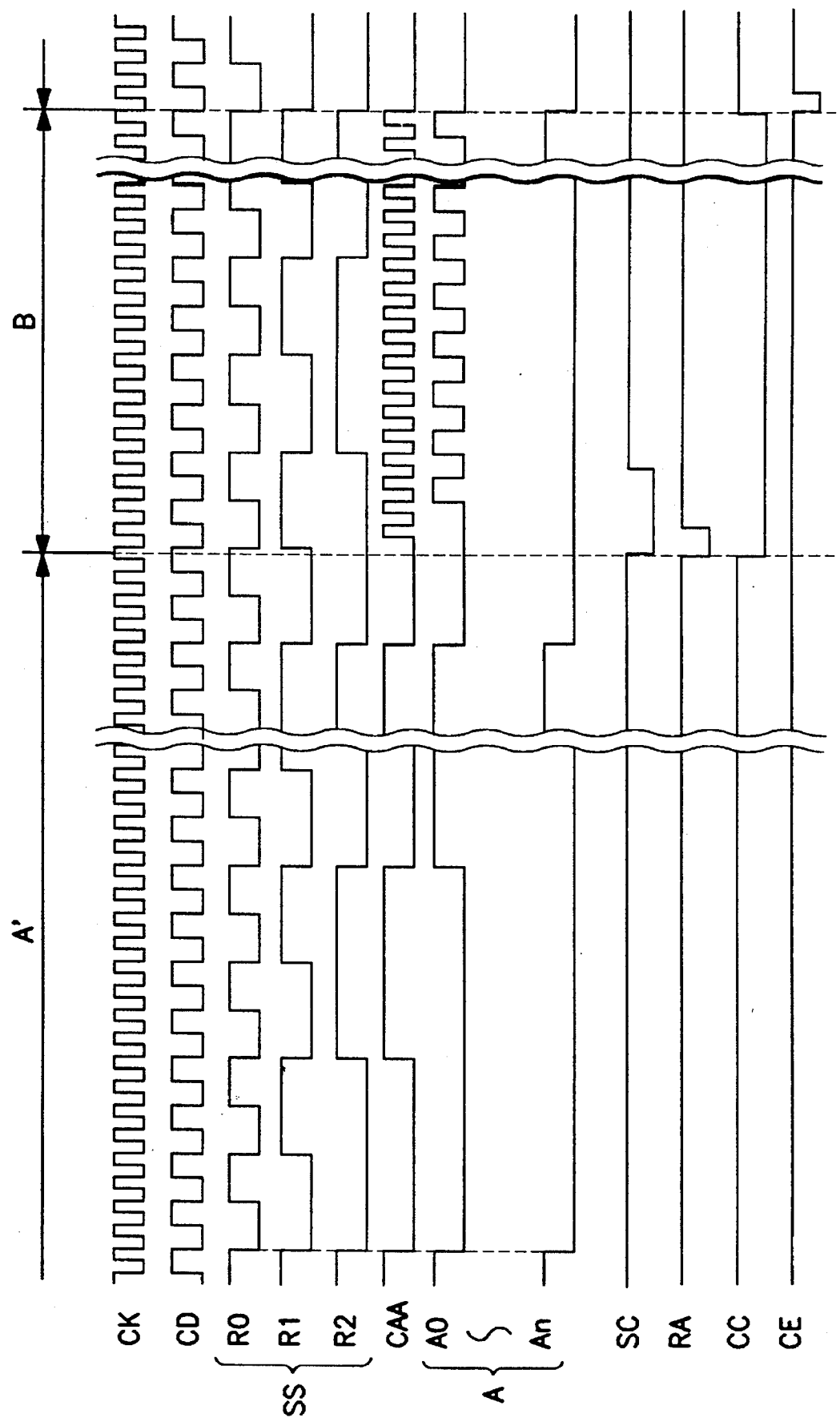
FIG. 2 is a flow chart showing an example of the operation in the memory circuit according to the first embodiment.

The description will now be given as to the operation of the present embodiment with reference to FIG. 1 and FIG. 2 which is an operation time chart. Firstly, during the period A in FIG. 2 in which the normal display is carried out without the supply of the clear signal SC, the data switching circuit 5 selects the display data DD as the write parallel data DW of the RAM 3, and the clock switching circuit 6 selects the clock CA as the clock CAA in response to an inactive level of the clear execution signal CC from the clear signal controlling circuit 7. The subsequent operation is the same as that of the first memory apparatus in the prior art, and the display data DD is written in the RAM 3. Accordingly, further detailed description will be omitted.

Secondly, during the period B in which the clear operation is performed with the supply of the clear signal SC, the clear signal controlling circuit 7 generates the reset signal RA to reset the address counter 2 in response to the input of the clear signal SC and activates the clear execution signal CC. In accordance with the active level of the clear execution signal CC, the data switching circuit 5 switches to select the blank data BD as the write parallel data DW of the RAM 3 and the clock switching circuit 6 switches to select the clock CK as the clock CAA. As described above, since the counter 1 is a four-bit binary counter and the speed of the clock CK is hence 16 times as fast as that of the clock CA, the address counter 2 operates during the clear operation at a speed which is 16 times as fast as that at the time of normal display operation, and the blank data DB is written in the RAM 3 at this speed when the writing of the blank data DB to all the addresses of the RAM 3 is completed by the address signals A0 to An fed from the address counter 2, the RAM 3 is equivalently cleared.

In response to the generation of a final address signal, the address counter 2 produces and supplies a clear completion detection signal CE to the clear signal controlling circuit 7. The clear signal controlling circuit 7 thereby deactivates the clear execution signal CC in response to the input of the clear completion detection signal CE. The clear operation is thus completed and the normal display is commenced.

If the time required for clearing one frame is below 10 mS in the prior art, since the present embodiment uses as the clock CAA the clock CK whose speed is 16 times as fast as that of the clock CA, the time required for the clear operation is greatly shortened to be 1/16.

Figure 3:
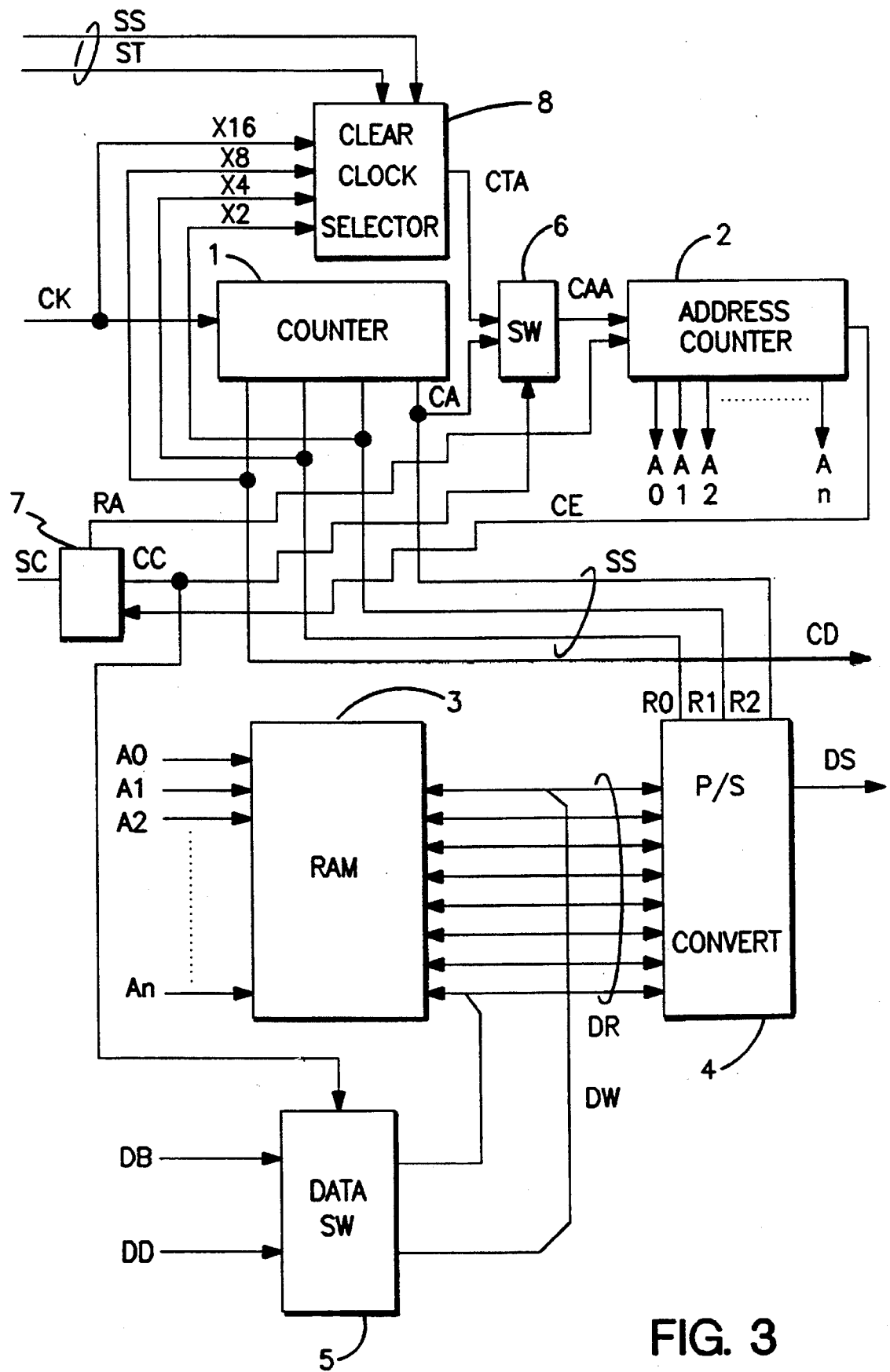
FIG. 3 is a block diagram showing a second embodiment of a memory circuit according to the present invention.

Referring to FIG. 3 which is a block diagram showing a second embodiment of the memory apparatus according to the present invention by similarly giving like reference characters/numerals to like or corresponding elements in FIG. 1, a difference between the present embodiment and the first embodiment is that the memory apparatus is additionally provided with a clear clock selecting circuit 8 for selecting one from multiple speeds of the clock CA which are 2, 4, 8 and 16 times faster as a speed of a clock CTA for the clear operation in response to the supply of a two-bit clear time selection signal ST.

At the time of clear operation, the clear clock selecting circuit 8 generates a previously-selected speed as the clock CTA in response to the input of the clear time selection signal ST and supplies the generated signal as the clock CAA through the clock switching circuit 6 to the address counter 2.

An optimum clear time can be consequently selected in accordance with the access time performance of the RAM 3.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A memory circuit comprising a clock counter responding to a first clock signal and producing a second clock signal which has a clock rate lower than said first clock signal, a display memory temporarily storing data, an address counter for generating address information in response to a clock signal supplied thereto and accessing said display memory by use of said address information, and means responsive to a control signal for selecting and supplying said first clock signal to said address counter when said control signal assumes a first state and selecting and supplying said second clock signal to said address counter when said control signal assumes a second state.

2. The circuit as claimed in claim 1, when said control signal assumes said first state during a clear operation in which said display memory is written with clear data and said second states during a display operation in which display data are written into and read out of said display memory.

3. The circuit as claimed in claim 1, wherein said address counter produces a state change signal when said address information is updated up to a final value, said control signal being changed from said first state to said second state by said state change signal.

4. The circuit as claimed in claim 1, wherein said clock counter further produces a third clock signal which has a clock rate lower than said first clock signal and different from said second clock signal, and said means selects and supplies said third clock signal to said address counter when said control signal assumes a third state.

* * * * *